(12) United States Patent
Liao

(10) Patent No.: US 10,206,302 B2
(45) Date of Patent: Feb. 12, 2019

(54) EJECTOR LATCH ASSEMBLY AND SYSTEM FOR SECURING A BOARD WITHIN A FRAME

(71) Applicant: Southco, Inc., Concordville, PA (US)

(72) Inventor: Xiaoying Liao, Dongguan (CN)

(73) Assignee: Southco, Inc., Concordville, PA (US)

( * ) Notice: Subject to any disclaimer, the term of this patent is extended or adjusted under 35 U.S.C. 154(b) by 0 days.

(21) Appl. No.: 15/833,371

(22) Filed: Dec. 6, 2017

(65) Prior Publication Data

US 2018/0168061 A1 Jun. 14, 2018

(30) Foreign Application Priority Data

Dec. 8, 2016 (CN) .................. 2016 2 1346927 U

(51) Int. Cl.
| | |
|---|---|
| *H05K 7/14* | (2006.01) |
| *H05K 5/02* | (2006.01) |
| *G06F 1/18* | (2006.01) |

(52) U.S. Cl.
CPC ............ *H05K 7/1417* (2013.01); *G06F 1/18* (2013.01); *G06F 1/181* (2013.01); *G06F 1/183* (2013.01); *H05K 5/023* (2013.01); *H05K 7/1489* (2013.01)

(58) Field of Classification Search
None
See application file for complete search history.

(56) References Cited

U.S. PATENT DOCUMENTS

| | | | | | |
|---|---|---|---|---|---|
| 3,511,549 | A * | 5/1970 | MacAluso | ............ | E05B 65/462 312/219 |
| 4,006,951 | A * | 2/1977 | Geer | .............. | E05B 65/46 312/332.1 |
| 4,875,867 | A * | 10/1989 | Hoo | ............. | H05K 7/1409 361/753 |
| 4,975,073 | A * | 12/1990 | Weisman | ............ | H05K 7/1409 439/153 |
| 5,499,925 | A * | 3/1996 | Lwee | ............. | G06K 13/08 439/155 |
| 6,315,586 | B1 * | 11/2001 | Joyce | ............. | G06F 1/184 439/157 |
| 6,953,232 | B2 * | 10/2005 | Busby | ............ | A47B 81/06 292/196 |

(Continued)

OTHER PUBLICATIONS

Taiwan Office Action for Taiwan Application No. 106218227, dated Mar. 16, 2018, including English translation, 3 pages.

*Primary Examiner* — Xanthia C Cunningham
(74) *Attorney, Agent, or Firm* — RatnerPrestia

(57) ABSTRACT

Ejector latch assemblies for securing a board within a frame and a computer assembly using the ejector latch assembly are disclosed. An ejector latch assembly includes a base and a handle pivotably coupled to the base. The handle includes a first handle segment, a second handle segment and a release structure. The first handle segment is coupled to the base. The base is coupled to a board. The first handle segment is pivotable relative to the base between a closed and an open position. The first handle segment is coupled to the second handle segment. The second handle portion is pivotable relative to the first handle segment between an extended and a retracted position. The release structure is movable between an engaged and a released position. When in the engaged position, the release structure prevents pivoting of the second handle segment relative to the first handle segment.

18 Claims, 19 Drawing Sheets

(56) References Cited

U.S. PATENT DOCUMENTS

| | | | | |
|---|---|---|---|---|
| 7,125,272 | B1 * | 10/2006 | Liang | H05K 7/1489 |
| | | | | 439/160 |
| 8,587,957 | B2 * | 11/2013 | Shu | G11B 33/124 |
| | | | | 361/679.32 |
| 8,628,341 | B2 * | 1/2014 | Li | H05K 7/1409 |
| | | | | 439/157 |
| 8,737,077 | B2 * | 5/2014 | Zhang | G06F 1/187 |
| | | | | 248/544 |
| 8,915,557 | B2 * | 12/2014 | Doglio | H05K 7/1489 |
| | | | | 312/222 |
| 9,226,425 | B2 * | 12/2015 | Hsu | H05K 7/1488 |
| 9,253,912 | B2 * | 2/2016 | Skirmont | H05K 7/1409 |
| 9,253,914 | B2 * | 2/2016 | Demange | H05K 7/1487 |
| 9,545,028 | B2 * | 1/2017 | Hoshino | H05K 7/1411 |
| 2005/0111178 | A1 * | 5/2005 | Bradley | G06F 1/184 |
| | | | | 361/679.38 |
| 2006/0215373 | A1 * | 9/2006 | Joist | H05K 7/1409 |
| | | | | 361/726 |
| 2009/0086456 | A1 * | 4/2009 | Milo | H05K 7/1409 |
| | | | | 361/801 |
| 2011/0095153 | A1 * | 4/2011 | Zhang | G06F 1/187 |
| | | | | 248/309.1 |
| 2012/0236474 | A1 * | 9/2012 | Chang | G06F 1/181 |
| | | | | 361/679.01 |
| 2013/0130528 | A1 * | 5/2013 | Jun | H05K 7/1409 |
| | | | | 439/160 |
| 2017/0329371 | A1 * | 11/2017 | Schmidtke | H05K 7/20736 |

* cited by examiner

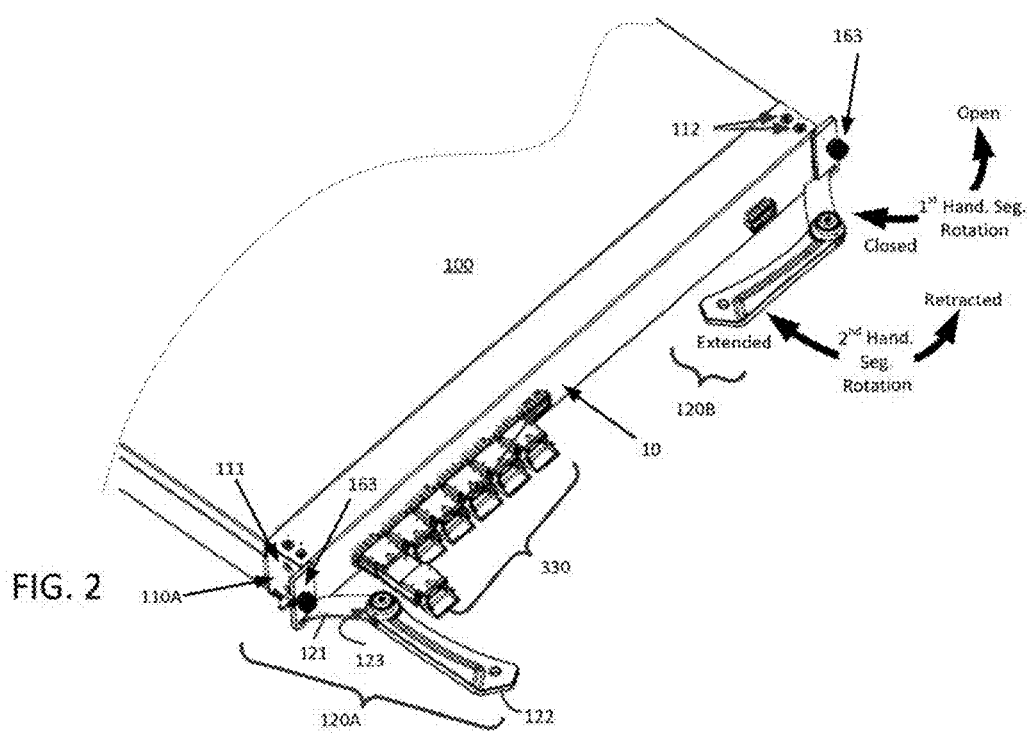

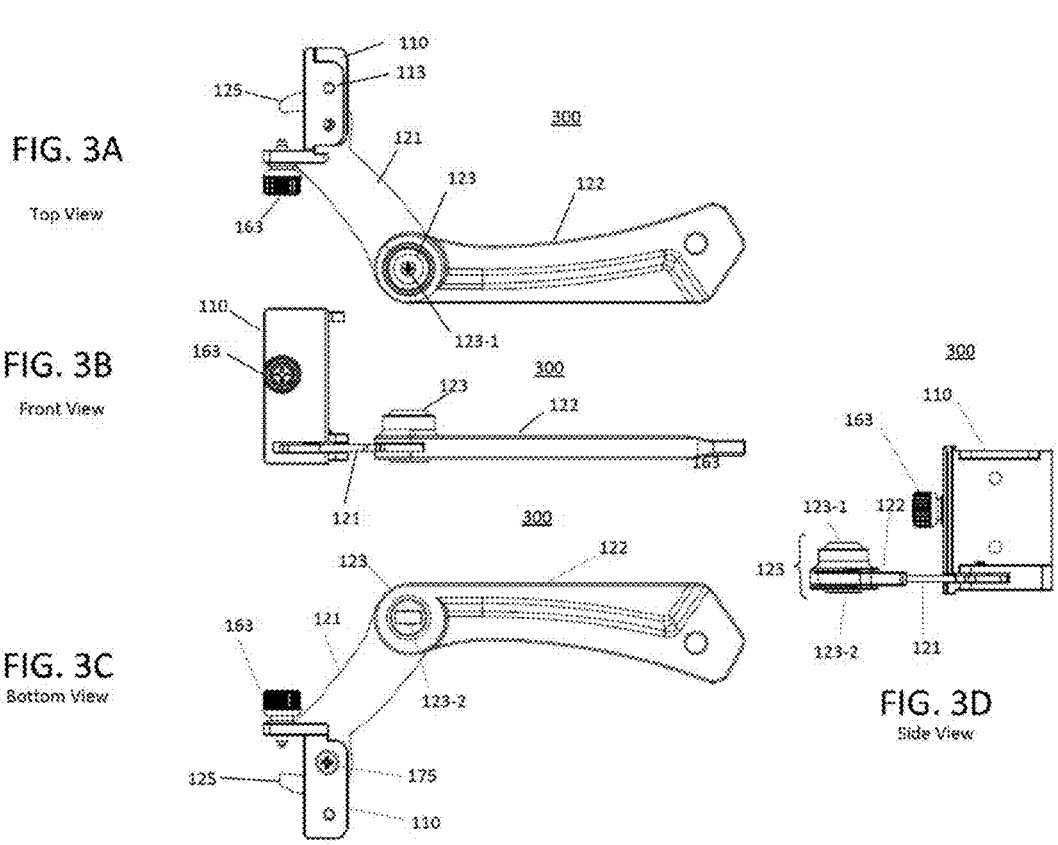

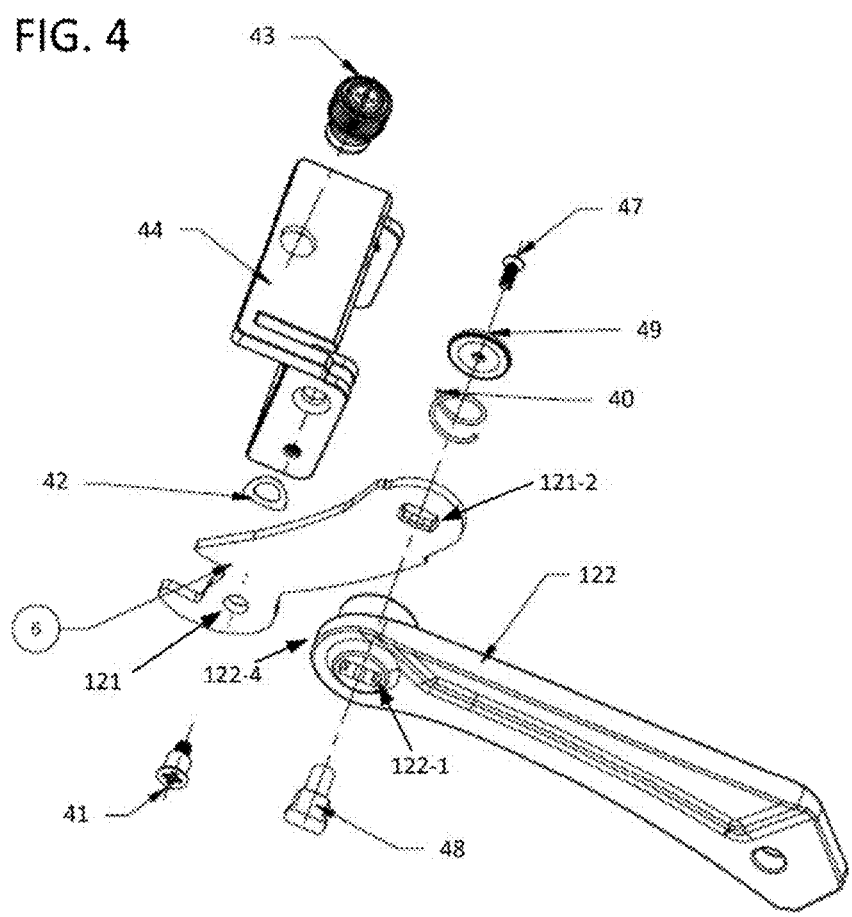

SECTION A-A

SECTION A-A

Section X-X

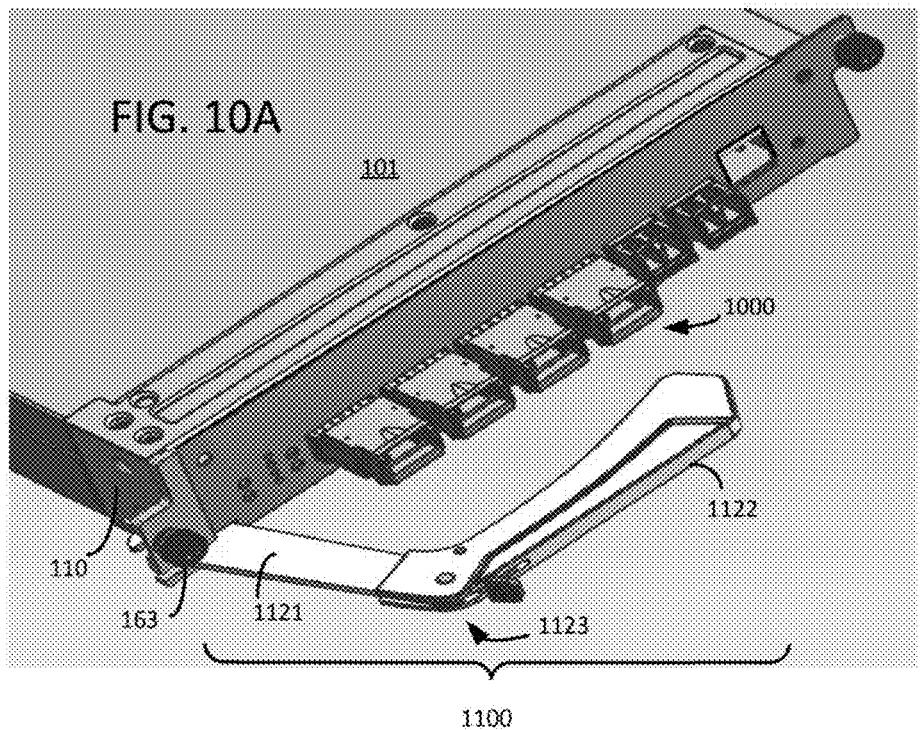
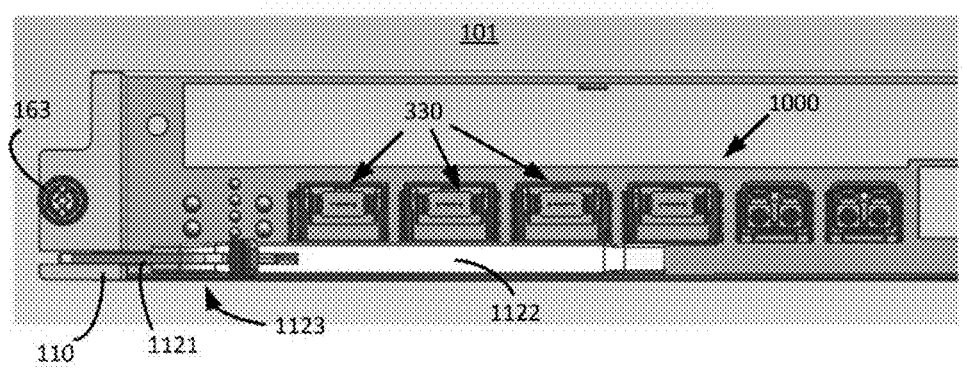

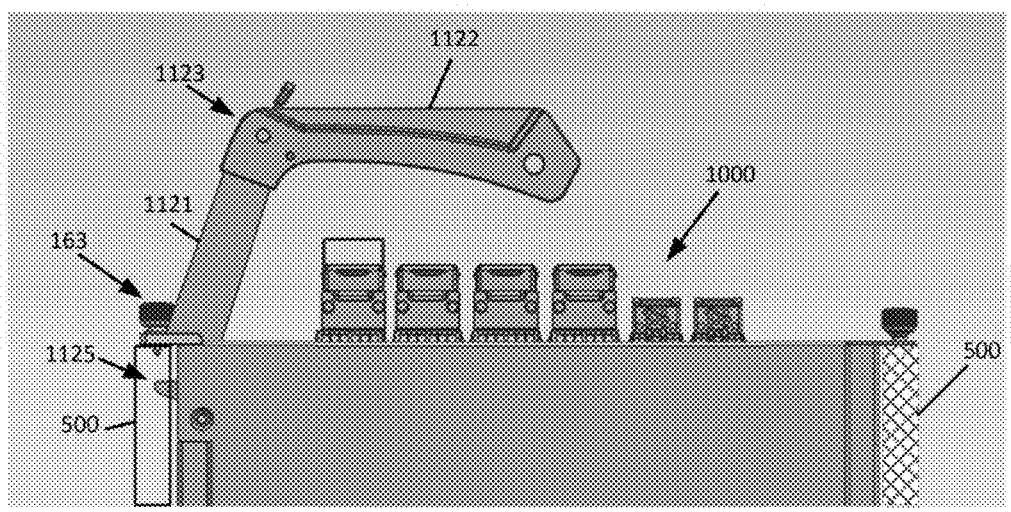
FIG. 11A  Side view of Extended Position of Second Handle segment
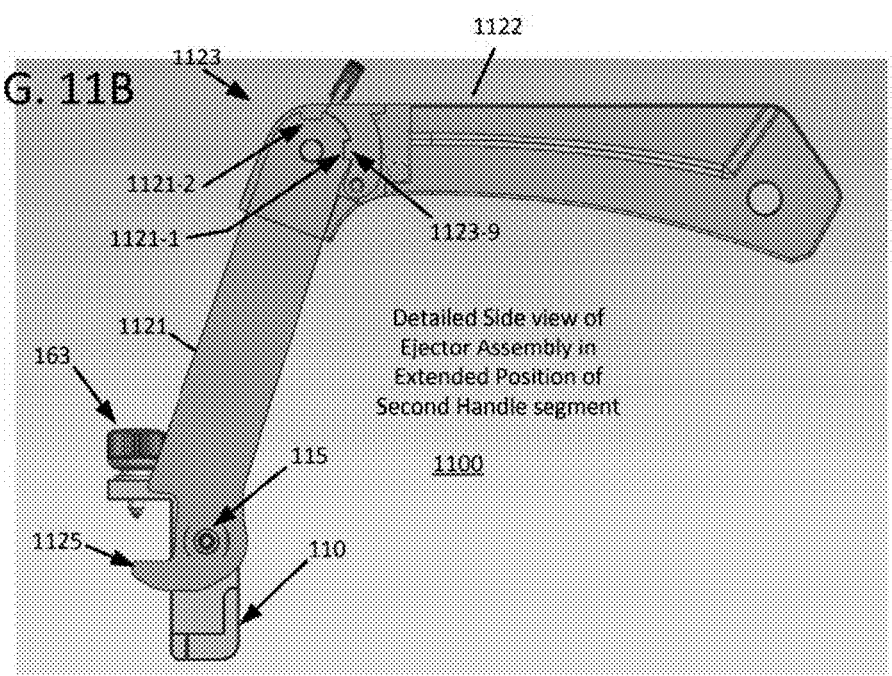
FIG. 11B  Detailed Side view of Ejector Assembly in Extended Position of Second Handle segment

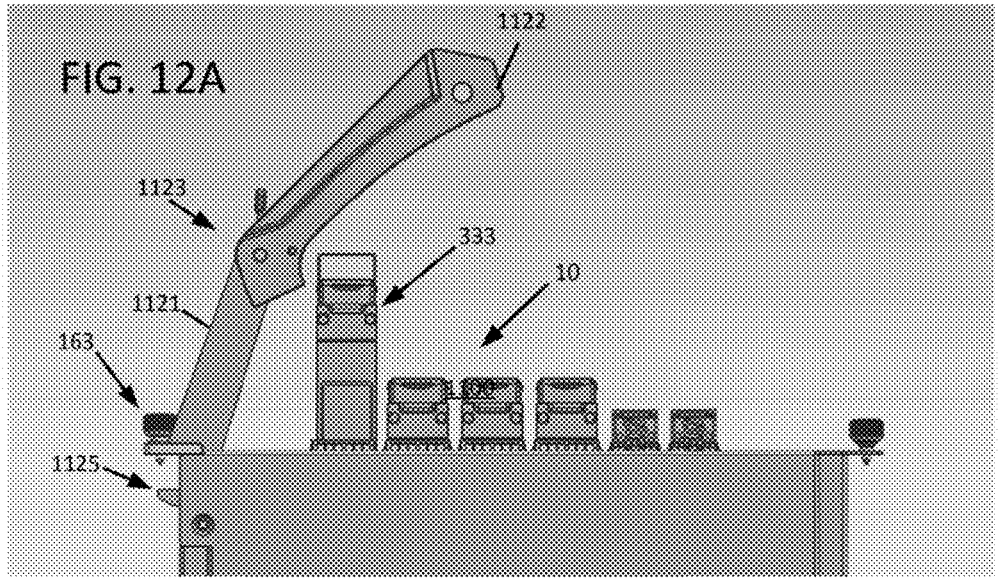
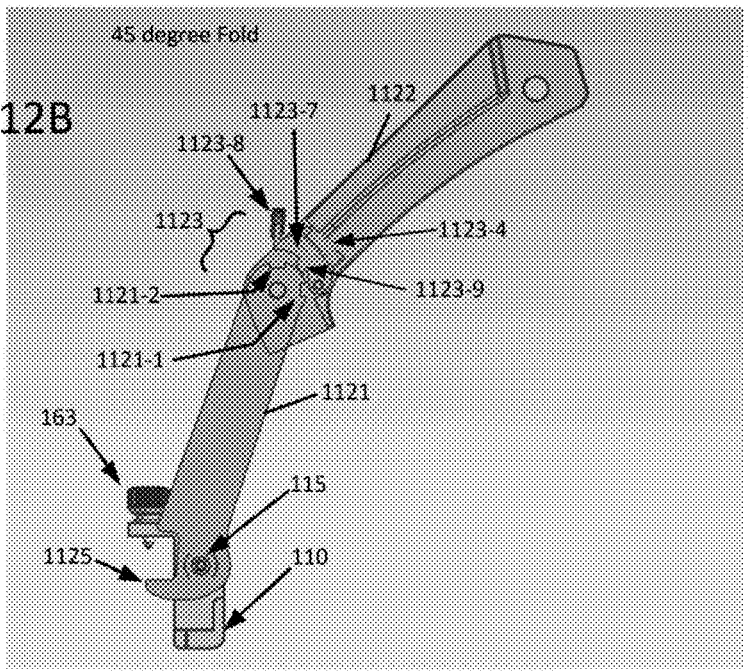

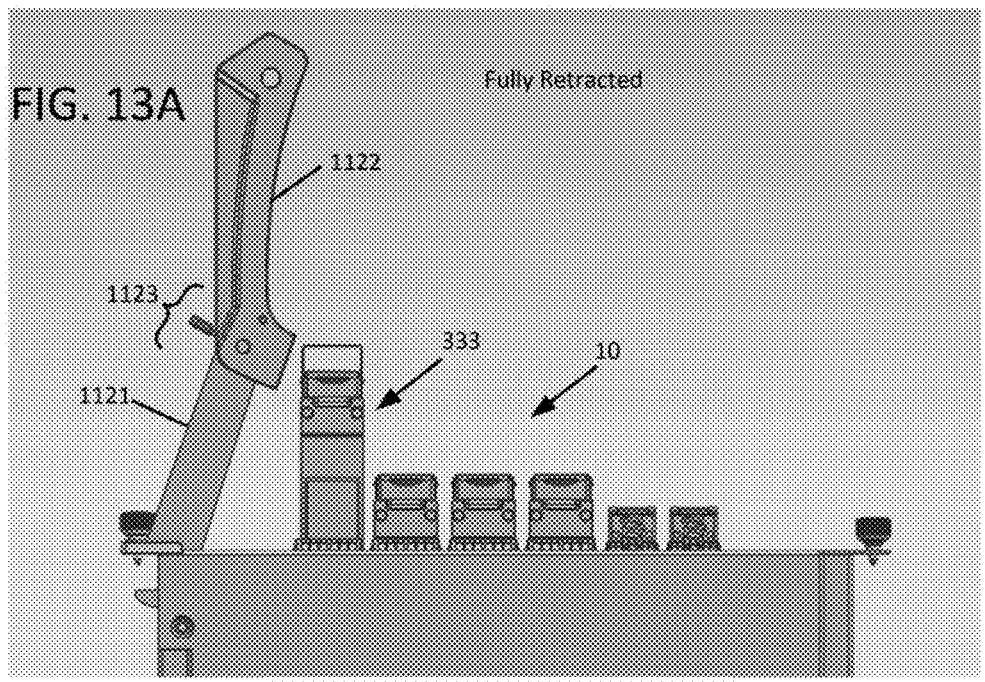
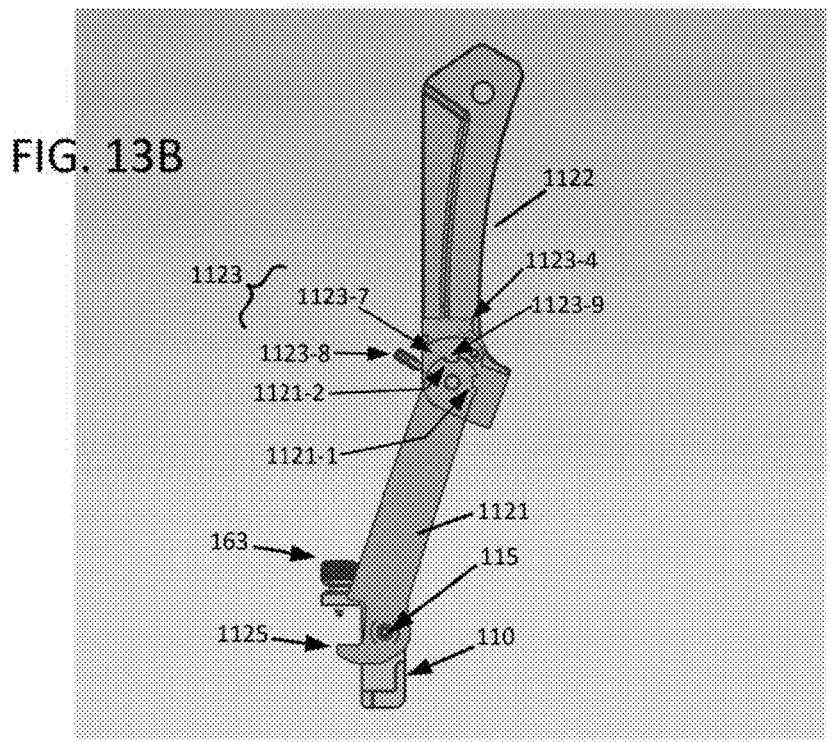

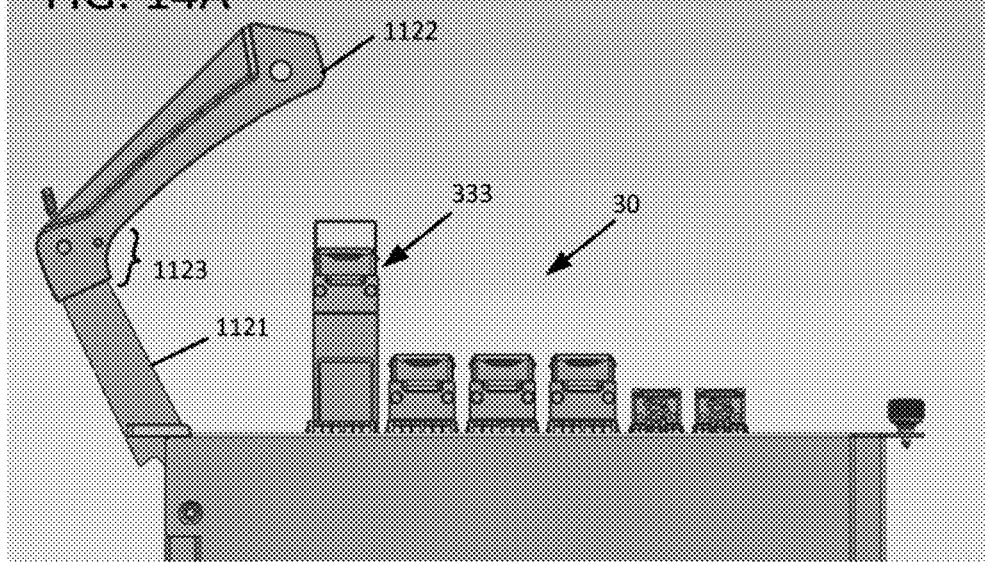
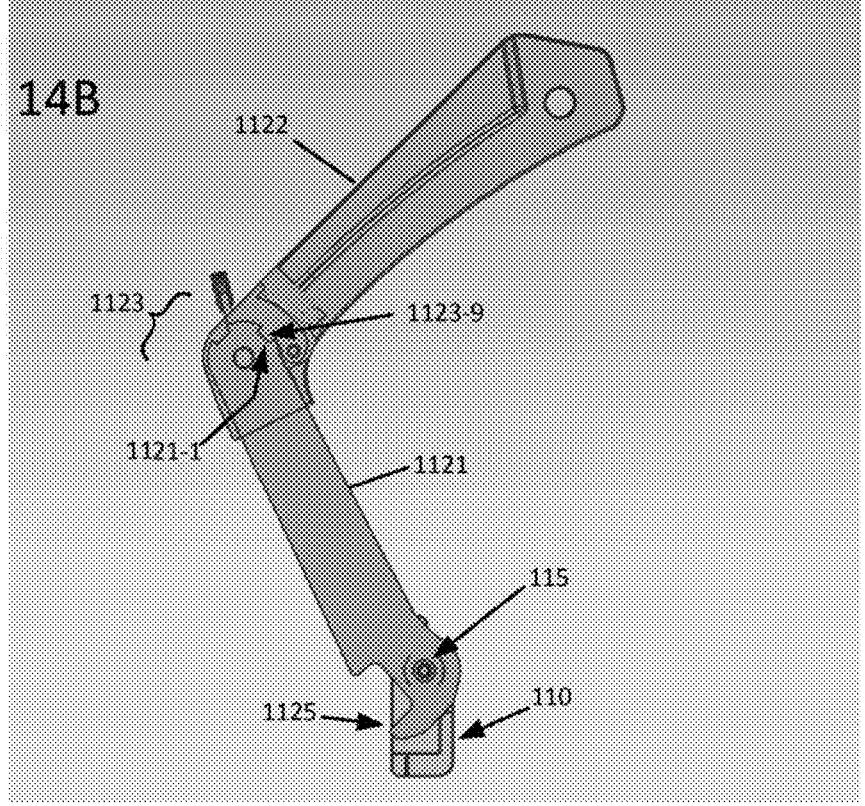

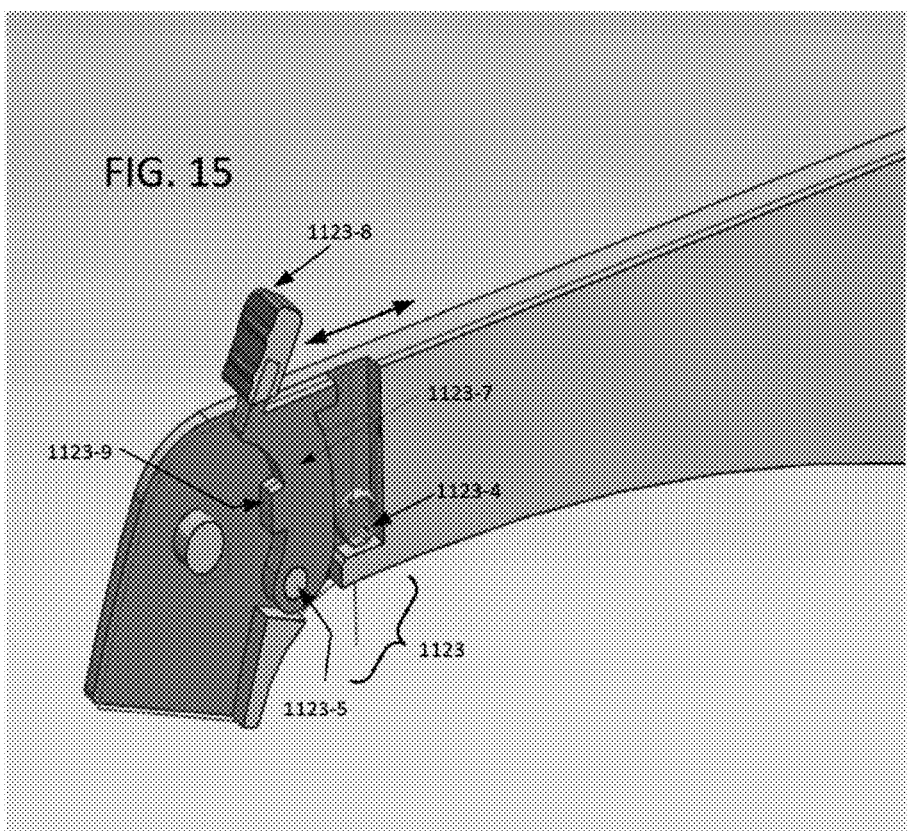

SECTION A-A

SECTION C-C

SECTION B-B

EJECTOR LATCH ASSEMBLY AND SYSTEM FOR SECURING A BOARD WITHIN A FRAME

CROSS-REFERENCE TO RELATED APPLICATION

This application dams the benefit under 35 U.S.C. § 119 of Chinese Patent Application No. 201621346927.1 filed Dec. 8, 2016, the contents of which are incorporated herein by reference in their entirety.

FIELD OF THE INVENTION

The present invention relates generally to securing a board within a case, and particularly, to ejector mechanisms for securing printed circuit boards within server racks or cabinets.

BACKGROUND OF THE INVENTION

Generally, computing devices such as personal computers or servers include a number of printed circuit boards (PCBs) mounted in racks, trays, or rails within a larger, framed box. The PCBs are typically coupled to multiple electrical connections in order to receive power or transmit or receive electrical signals. Accordingly, the PCBs must be consistently and securely positioned within the computing device in order to maintain secure and reliable electrical connections.

Release mechanisms known as "ejectors" have been used to insert or eject PCBs into or out of a desired slot. Ejectors may attach to the front (or "faceplate") of the PCB, and employ a mechanical operation to reliably secure or release the PCB within the computing device's box. As computing devices continue to increase in popularity and use, the number and diversity of PCBs likewise is increasing. Accordingly, improved systems and devices are desired for inserting or ejecting PCBs.

SUMMARY OF THE INVENTION

Aspects of the present invention are related to ejector latch assemblies and systems for securing a board within a frame.

In accordance with one aspect of the present invention, an ejector latch assembly is disclosed. The ejector latch assembly is configured for securing a board within a frame. The ejector latch assembly includes a base, and a handle. The base is configured to be coupled to a board. The handle is mounted to the base. The handle has a first handle segment, a second handle segment and a release structure. The first handle segment has a proximal end portion and a distal end portion pivotably coupled to the base. The first handle segment is pivotable relative to the base between a closed position and an open position. The second handle segment has a distal end portion pivotably coupled to the proximal end portion the first handle segment. The second handle portion is pivotable relative to the first handle segment between an extended position and a retracted position when the first handle segment is in the closed position. The release structure is movable between an engaged position in which the release structure prevents pivoting of the second handle segment relative to the first handle segment and a released position in which the release structure does not prevent pivoting of the second handle segment relative to the first handle segment. The first handle segment and the second handle segment are positioned to increase access to the board secured within the frame when the first handle segment is maintained in the closed position and the distal end portion of the second handle segment is pivoted relative to the proximal end portion of the first handle segment toward the retracted position.

In accordance with another aspect of the present invention, the release structure can include a button movable between an extended position in which the release structure is in the engaged position and a depressed position in which the release structure is in the released position. The release structure can include a shaft movable between an engaged position and a depressed position in which the release structure is in the released position, the shaft being biased toward the engaged position and movable toward the released position by depression of the button.

In accordance with another aspect of the present invention, the release structure can include an actuator movable between a first position in which the release structure is in the engaged position and a second position in which the release structure is in the released position. The actuator can include a lever pivotally mounted to the first handle segment or the second handle segment of the handle, the lever being movable between an engaged position and a pivoted position in which the release structure is in the released position, the lever being biased toward the engaged position and movable toward the pivoted position by pivoting the lever relative to the first handle segment or the second handle segment of the handle.

In accordance with another aspect of the present invention, a computer assembly is disclosed. The computer assembly includes a frame, a board, and an ejector latch assembly. The board is secured to the frame configured for securing a board within a frame is disclosed. The ejector latch assembly is configured for securing a board within a frame. The ejector latch assembly includes a base, and a handle. The base is configured to be coupled to a board. The handle is mounted to the base. The handle has a first handle segment, a second handle segment and a release structure. The first handle, segment has a proximal end portion and a distal end portion pivotably coupled to the base. The first handle segment is pivotable relative to the base between a closed position and an open position. The second handle segment has a distal end portion pivotably coupled to the proximal end portion of the first handle segment. The second handle portion is pivotable relative to the first handle segment between an extended position and a retracted position when the first handle segment is in the closed position. The release structure is movable between an engaged position in which the release structure prevents pivoting of the second handle segment relative to the first handle segment and a released position in which the release structure does not prevent pivoting of the second handle segment relative to the first handle segment. The first handle segment and the second handle segment are positioned to increase access to the board when the first handle segment is maintained in the closed position and the distal end portion of the second handle segment is pivoted relative to the proximal end portion of the first handle segment toward the retracted position.

In accordance with another aspect of the present invention, a process for increasing access to a board supported in a frame of a computer system is disclosed. The board is secured within the frame using an ejector latch assembly in which a first handle segment of a handle of the ejector latch assembly is relative to a base of the ejector latch assembly toward a closed position. A release structure of the ejector latch assembly is moved from an engaged position in which the release structure prevents pivoting of a second handle segment of the handle relative to the first handle segment to a released position in which the release structure does not prevent pivoting of the second handle segment of the handle relative to the first handle segment of the handle. The second handle segment of the handle is pivoted relative to the first handle segment of the handle toward a retracted position when the first handle segment is in the closed position, thereby increasing access to the board while the first handle segment of the handle is maintained in the closed position.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features may be arbitrarily expanded or reduced for clarity. Included in the drawings are the following figures:

FIG. 2 depicts a perspective view of system including two ejectors with a first release structure in which the second handle segment of the respective ejectors is in an extended position and a retracted position;

FIG. 3A depicts a top view of an ejector;
FIG. 3B depicts a front view of an ejector;
FIG. 3C depicts a bottom view of an ejector;
FIG. 3D depicts a side view of an ejector from the exterior of a frame;
FIG. 4 depicts an exploded perspective view of an ejector;
FIG. 10A depicts a perspective view of system including second embodiment ejectors with second release, structure in the extended position holding as an example, a transceiver module board in place;
FIG. 10B depicts a front view with second embodiment ejector pivoted to retracted position showing the access to transceiver module board provided by ejector in the retracted position;
FIG. 11A is a side view of a second embodiment of an ejector latch assembly with the second handle segment in the extended position;

FIG. 11B depicts a detailed isolated, perspective view of the second embodiment ejector latch assembly 1100 in the extended position;
FIG. 12A illustrates a handle of an ejector latch assembly incorporating the second embodiment of the release mechanism in a forty-five degree (45°) fold between the first handle segment and the second handle segment;
FIG. 12B depicts a detailed isolated, side view of the second embodiment ejector latch assembly 1100 in a forty-five degree (45°) fold between the first handle segment and the second handle segment;
FIG. 13A depicts a side view with second embodiment ejector pivoted to retracted position showing the access to transceiver module board provided when the ejector handle is in the retracted position;
FIG. 13B depicts detailed isolated, view of the second embodiment of the ejector latch assembly in the retracted position;
FIG. 14A depicts a side view with second embodiment ejector latch assembly pivoted to open position for removing a board inserted in the frame;
FIG. 14B depicts detailed isolated, side view of the second embodiment of the ejector latch assembly rotated to the open position for removing a board inserted in the frame;
FIG. 15 depicts a detailed perspective view of system of the second embodiment of the release structure.

DETAILED DESCRIPTION OF THE INVENTION

The exemplary systems and assemblies disclosed herein are usable for securing a board within a frame. For example, the systems and assemblies may be used for inserting a board within a frame, and/or may be used for electing a board from a frame. As used herein, the term "board" is intended to encompass any card, sheet, or other flexible or rigid surface (whether planar or nonplanar) having any desired size or shape. Additionally, as used herein, the term "frame" is intended to encompass any slot, rack, tray, rail, or other structure into which a board may be secured or associated. The term "frame" may or may not encompass additional structural components associated with the slot, rack, tray, or rail in which the board is secured, including related chassis, housings, boxes, or other associated structural components.

The exemplary systems and assemblies disclosed herein may be particularly useful in conjunction with printed circuit boards (PCBs) (i.e., "boards"). The exemplary systems and assemblies may be designed for attachment to a faceplate of a PCB. Additionally, the exemplary systems and assemblies may be configured to attach to or otherwise operate with computing devices such as computer or server chassis in order to insert or eject PCBs. Suitable PCBs and computing devices usable in conjunction with the disclosed exemplary systems and assemblies include, by way of example, telecommunications equipment. Other suitable PCBs or computing devices will be known to one of ordinary skill in the art from the description herein. While the exemplary systems and assemblies disclosed herein are principally described with respect to PCBs, it will nonetheless understood that the invention is not so limited.

Figure 1A:
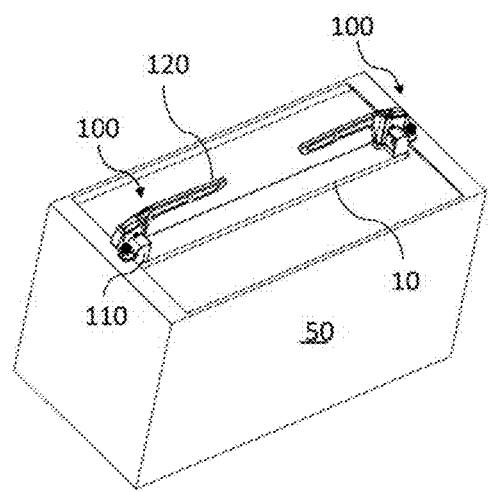
FIGS. 1A and 1B depict an exemplary embodiment of a system for securing a board within a frame, in combination with the board and frame, with the handles in a closed position, in accordance with aspects of the present invention.
Figure 1B:
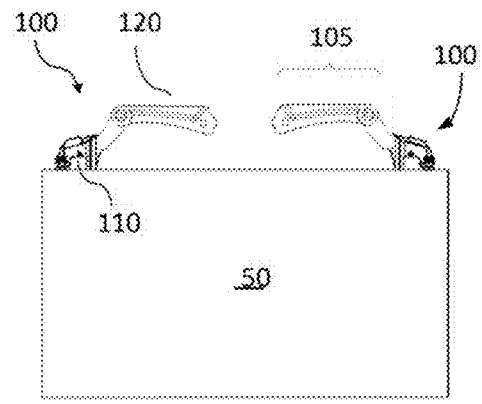

Referring now to the drawings, FIGS. 1A-1D illustrate an exemplary ejector latch assembly 100 for securing a hoard, such as a PCB, within a frame in accordance with aspects of the present invention. Assembly 100 may be usable to insert or eject a PCB, such as PCB from a frame of a computing device (e.g., server 50). As shown in FIGS. 1A-1D, there may be an assembly 100 provided on each side of the board being removed from the frame. As an overview, assembly 100 includes a base 110, and a handle 120. FIGS. 1A and 1B depict the handles 120 in a closed position. Additional details of assembly 100 are described below.

Base 110 is configured to be coupled to a board, such PCB 10. Base 110 provides an attachment between assembly 100 and the PCB 10 to be secured by assembly 100. As shown in FIG. 1A, base 110 can be coupled to PCB 10. In particular, base 110 may be coupled to a faceplate of PCB 10. Base 110 may comprise one or a plurality of different components. In an exemplary embodiment, base 110 is configured as shown in FIG. 16A-G to be coupled to PCB 10, or the remaining components of assembly 100, as will be described below.

Figure 1C:
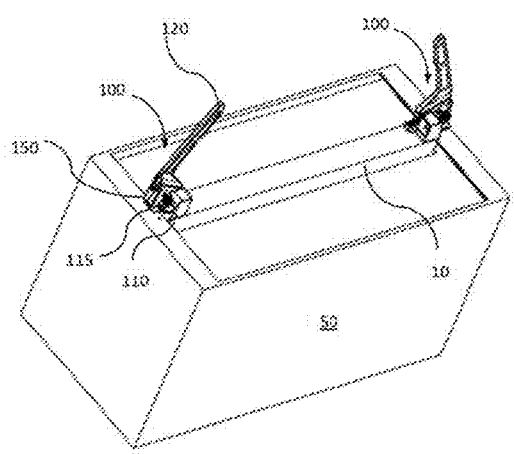
FIGS. 1C and 1D depict the system of FIG. 1A with the handles in the extended position.
Figure 1D:
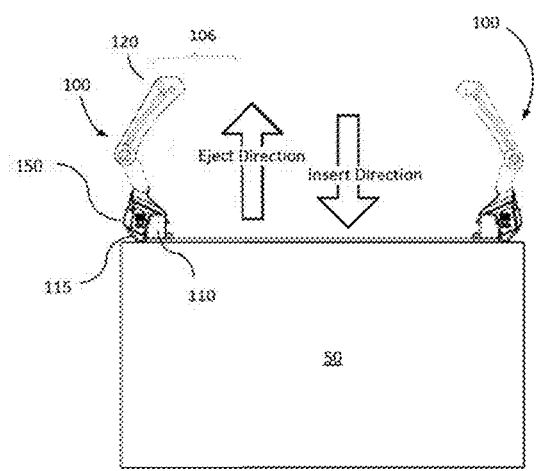

The handle 120 is shown in the closed 105 position in FIGS. 1A and 1B, and in the open position in FIGS. 1C and 1D. Handle 120 is pivotably coupled to base 110. Handle 120 enables a user to actuate assembly 100 to insert or eject the board from the frame. The handle 120 is shown in more detail in the following examples.

Handle 120 is pivotably coupled to base 110 via base pivot point 115. Base pivot point 115 is at the intersection of the handle 120 and base 110, and defines an axis of rotation (or pivot axis) around which handle 120 pivots.

Handle 120 includes an a first handle segment 121, a second handle segment 122 and a release mechanism 123, as shown in FIGS. 2 and 3. The second handle segment 122 is sized and configured to be grasped by a user of assembly 100 during operation of assembly 100.

FIGS. 1C and 1D depict the handles 120 in the open position. A projection 125 (shown in the examples of FIGS. 3A-C) is positioned to contact the frame 50, during pivoting of handle 120 from the closed position 105 to the open position 106. A board 10 is supported by a frame of the server 50. FIGS. 1C and 1D illustrate the contact between projection 125 and server frame 50 by showing the board 10 evacuation the frame 50. The contact between projection 125 and server frame 50 during pivoting of handle 120 toward open position 106 causes movement of PCB 10 out of server frame 50, as shown in FIGS. 1C and 1D. FIG. 1D shows the ejection direction and the insertion direction of board 10 when the board 10 is being respectively removed from or inserted into the server frame 50. The projection 125 and handle 120 thereby provide a levering action to eject PCB 10 from server frame 50. Improved operational and additional details regarding the pivoting of segments of handle 120 to allow access to boards 10 within a frame are discussed in more detail with reference to FIGS. 2-13.

FIG. 2 depicts a perspective view of system including ejector examples having a first release structure according to an aspect at the disclosed invention. In more detail with regard to the ejector latch assembly 100 and the board 10, the perspective view of FIG. 2 illustrates a board 10 coupled to ejector latch assembly handles 120A and 120B. The handle 120A is coupled to its respective base 110A as will be described in more detail with reference to later examples. Base 110A is coupled to the frame, such as frame 50 of FIG. 1A, by captive screw 163.

The handles 120A and 120E are of particular interest in the discussion of FIG. 2, therefore, detailed description of the bases 110A will be omitted from the following discussion. As mentioned above, the handles 120A and 120B as described herein provide improved access to components of the board 10 as compared to previous examples of ejector handles. Plural ejector latch assemblies 100 may be used to secure the board 10 within the frame 50. The handles 120A and 120B of FIG. 2 include all of the same components except that the two handles are mirror images of one another. Therefore, the foregoing description and discussion focuses on only one of the handles, but a similar description and discussion applies to other handle.

In the example shown in FIG. 2, the handle 120A includes a first handle segment 121, a second handle segment 122 and a release structure 123. The first handle segment 121 has a proximal end portion and a distal end portion pivotably coupled to the base 110A, the first handle segment 121 is pivotable relative to the base 110 between a closed position (e.g., as shown in FIG. 2) and an open position (not shown). The second handle segment 122 has a distal end portion pivotably coupled to the proximal end portion of the first handle segment 121. The second handle segment 122 being pivotable relative to the first handle segment 121 between an extended position (as shown FIG. 2) and a retracted position (shown in a later example) when the first handle segment 121 is in the closed position. The release structure 123 is movable between an engaged position (shown in more detail with reference to FIGS. 7A-7C) in which the release structure 123 prevents pivoting of the second handle segment 122 relative to the first handle segment 121 and a released position (shown in more detail with reference to FIGS. 5A-5C) in which the release structure does not prevent pivoting of the second handle segment 122 relative to the first handle segment 121. The first handle segment 121 and the second handle segment 122 are positioned such that access to the board 10 is increased when the first handle segment 121 is maintained in the closed position and the distal end portion of the second handle segment 122 is pivoted relative to the proximal end portion of the first handle segment 121 toward the retracted position, while the board 10 is secured within the frame 50. The arrow in FIG. 2 at the proximal end of the second handle segment 122 shows the rotation of the second handle segment 122 around the axis of the release structure 123 from the extended position (shown FIG. 2) to the retracted position (shown in later examples).

FIG. 2 also depicts one ejector pivoted to allow access to a particular board. The particular board in this example is a transceiver module 10. The transceiver module 10 may include one or more device cable receptacles 330 that receive cables from computing devices coupled to the computing device in which the board 10 is coupled. The transceiver module 10 includes fastener holes 112 through which fasteners, such as screws (not shown), may secure the transceiver module 10 to the base 110A. The captive screw 163 couples the ejector assembly as described above with reference to FIGS. 1A-1D. As shown, the first handle segment 121 is shown rotated to the closed position, and the second handle segment 122 is shown rotated to the retracted position. The second handle segment 122 pivots around the release structure 123 axis. The release structure 123 axis is downward directly through the center of release structure 123 and through the overlapping ends of the first handle segment 121 and the second handle segment 122 (and is shown in more detail in a later example). When in the retracted position the second handle segment, a user is able to gain access to the board, such as the transceiver module 10.

As shown in FIG. 2, the second handle segment 122, when in the retracted position, does not obstruct a user's access to the device cable receptacles 330 of the transceiver module 10. The first handle segment 121 and the second handle segment 122 are shown positioned to increase access to the board 10 secured within the frame, such as frame 50 of FIG. 1, when the first handle segment 121 is maintained in the closed position and the distal end portion of the second handle segment 122 is pivoted relative to the proximal end portion of the first handle segment 121 toward the retracted position. The first handle segment 121 pivotable between a closed position that secures a board 10 in the frame (not shown in this example) and an open position, which allows the board 10 to be removed, for example, by sliding, from the frame. The second handle segment 122 has a proximal end opposite the distal end. The distal end of the second handle segment 122 is closest to the release structure 123. The second handle segment 122 is pivotable from an extended position to a retracted position. In the extended position, the second handle segment 122 may block access to some portions of a board secured in the frame, such as device receptacles 330.

An example operation of the ejector latch assembly for increasing access to a board 10 supported in a frame 50 of a computer system may include securing the board 10 within the frame using an ejector latch assembly 1 in which a first handle segment of a handle of the ejector latch assembly is relative to a base of the ejector latch assembly toward a closed position. A release structure of the ejector latch assembly is moved from an engaged position in which the release structure prevents pivoting of a second handle segment of the handle relative to the first handle segment to a released position in which the release structure does not prevent pivoting of the second handle segment 122 of the handle relative to the first handle segment 121 of the handle. The second handle segment 122 of the handle 120A is pivoted relative to the first handle segment 121 of the handle toward a retracted position when the first handle segment is in the closed position, thereby increasing access to the board 10 while the first handle segment 121 of the handle is maintained in the closed position. Access to the at least one component is increased when the first handle segment is maintained in the closed position, and the distal end portion of the second handle segment is pivoted relative to the proximal end portion of the first handle segment toward the retracted position. Additional details of the ejector latch assembly will be described with reference to FIGS. 3A-6.

FIG. 3A depicts a top view of an ejector. As mentioned, the ejector 300 includes the base 110, the first handle segment 121, the second handle segment 122 and the release structure 123. In this view, the base 110 is shown with board screw holes 113 that enable the base to be secured to a board, such as 30, using board screws, such as 112 of FIG. 1, or other fasteners. Captive screws 153 secure the base 110 to a frame (not shown in these examples). The ejector tip projection 125 is also shown in this view that facilitates ejecting the board from the frame (not shown in the example). The release structure 123 in this example is a button-type mechanism. The button 123-1 may be actuated by a user which disengages the release structure 123 and thereby allowing the second handle segment 122 to pivot about the first handle segment 121.

FIG. 3B depicts a front view of the ejector 300. In this view, proximal end of the first handle segment 121 is shown inserted into the distal end of the second handle segment 122. The captive screw 163 is positioned substantially in the center of the base 110. The release structure 123 secures the position of the second handle segment 122 relative to the first handle segment 121.

FIG. 3C depicts a bottom view of the ejector 300. In this view, the first handle segment/base pivot point 175 is visible. A screw or other fastener may act to secure the first handle segment 121 to the base 110. In this view, the bottom side of the release structure 123 is shown and the shaft 123-2 that is moved by user's actuation of the button 123-1. The shaft 123-2, as will be described with reference to a later example, acts to secure or release the second handle segment 122 from the first handle segment 121.

FIG. 3D depicts a side view of the ejector 300. The ejector 300 in this view shows a side view that includes the base 110, the captive screw 163, the first handle segment 121, the release structure 123 inserted through the second handle segment 122. In addition, base holes 111 for receiving fasteners that secure the base 110 to a board (not shown in this example).

FIG. 4 depicts an exploded perspective view of an ejector latch assembly. In FIG. 4, element 163 is a captive screw for coupling the base 110 to a frame, such as the server frame 50. The washer 42 is adjacent to the first handle segment 121. The first handle segment 121 has a distal end portion having a distal end hole, and a proximal end. The proximal end of the first handle segment 121 having a proximal end release structure hole 121-2. A screw 41 inserted through the distal end hole 121-1 of the first handle segment 121 couples the first handle segment 121 to the base 110. The second handle segment 122 has a distal end and a proximal end. The distal end of the second handle segment 122 includes a distal end hole 122-1 that secures the second handle segment 122 to the first handle segment 121. In an example, the second handle segment 122 has a distal end opening 122-3 into which the first handle segment 121 fits. The release structure hole of the first handle segment 121 aligns with the distal end hole 122-1 of the second handle segment 122. The components of the release structure, such as 123 of FIG. 3, include a screw 47, a shaft 48, a button 49, and a spring 40. In this example of a release structure, the spring 40 maintains pressure between the button and a surface of the second handle segment 122. The button 49 is oriented for movement along a depression axis and the distal end portion of the second handle segment 122 pivots relative to the proximal end portion of the first handle segment 121 about the depression axis. By maintaining pressure on the button 49, the spring 40 causes the shaft 48 to fill the distal end hole 122-1 of the second handle segment 122. As a result, the release structure is in an engaged position until the spring 40 is compressed by a user depressing the button 49 thereby causing the shaft 48 to substantially clear the proximal end release structure hole 121-2 of the first handle segment 121.

Figure 5A:
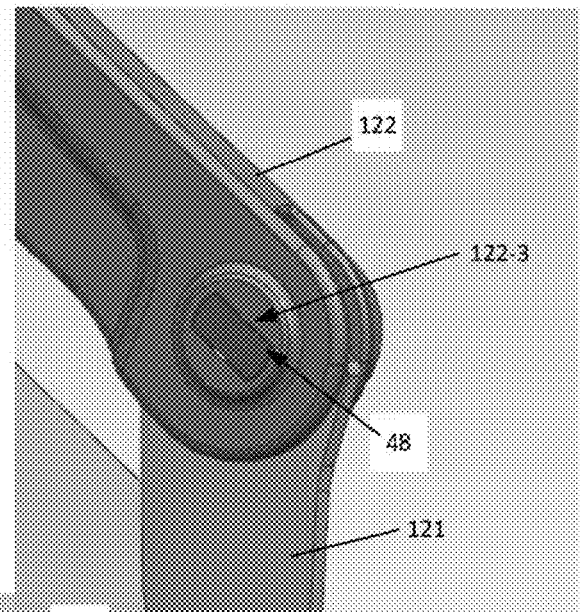
FIGS. 5A and 5B show a perspective view of a first release structure in an engaged and a released position, respectively.
Figure 5B:
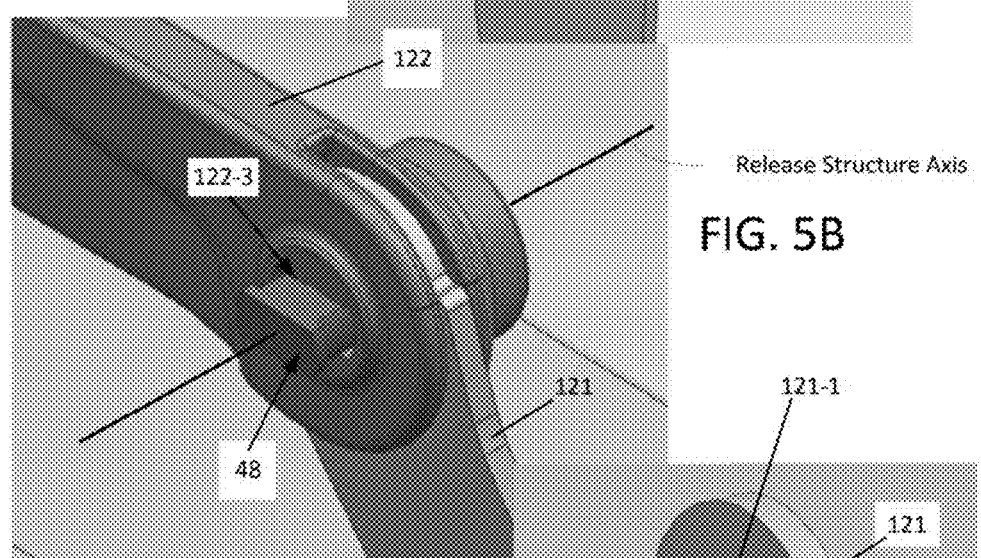

FIGS. 5A and 5B show a bottom perspective view of a first release structure in an engaged and a released position, respectively. FIG. 5A shows the position of the shaft 48 when the release structure 123 is in the engaged position. When the release structure 123 is in the engaged position, the shaft 48 remains substantially even with the surface of the second handle segment 122, the release structure 123 prevents pivoting of the second handle segment 122 relative to the first handle segment 121. FIG. 5B shows the position of the shaft 48 of the release structure 123 when the release structure 123 is in the released position. In the released position, the shaft 48 of the release structure 123 protrudes from the surface of the second handle segment 122. When the release structure 123 is in the released position, the release structure 123 does not prevent pivoting of the second handle segment 122 relative to the first handle segment 121.

Figure 5C:
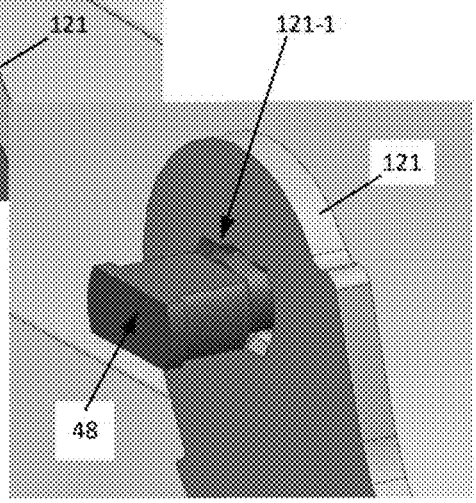
FIG. 5C shows a perspective view of a shaft of the first release mechanism released, and with the second handle segment removed.

FIG. 5C shows a perspective view of a shaft of the first release mechanism released, and with the second handle segment removed. As shown, the shaft 48 is configured to fill and engage a release structure opening 121-1 in the first handle segment 121. The shaft 48 will be described in more detail with reference to FIGS. 8A-C.

Figure 6A:
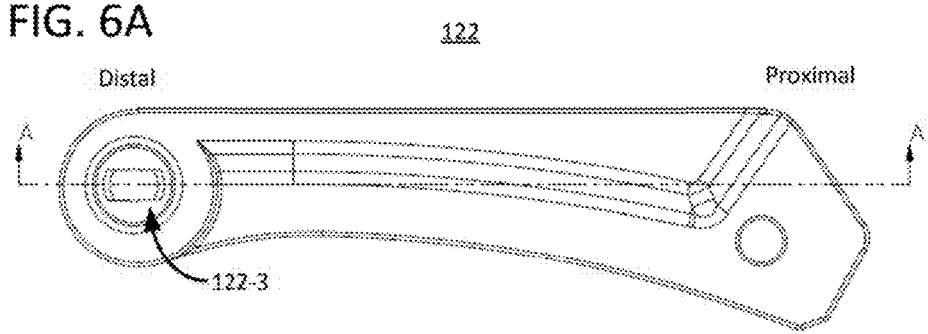
FIG. 6A depicts a right side view of the second handle segment.
Figure 6B:
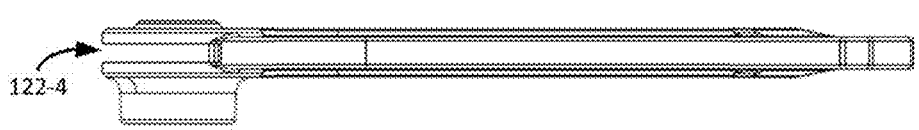
FIG. 6B depicts a top view of the second handle segment.
Figure 6C:
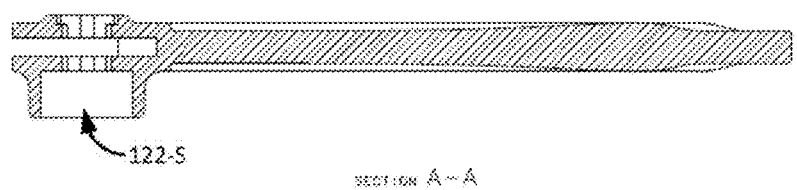
FIG. 6C depicts a cross-section view of the second handle segment.

FIG. 6A depicts a right side view of the second handle segment 122. The second handle segment includes a distal end and a proximal end. At the distal end of the second handle segment 122 is an elongated area 122-3 for the shaft 48 of release structure 123 that the shaft 48 fills when the release structure is in the engaged position. FIG. 6B depicts a top view of second handle segment 122 that shows the opening 122-4 into which is inserted the proximal end of the first handle segment 121 when the first handle segment 121 and the second handle segment 122 are coupled together. FIG. 6C depicts a cross-section view of the side of second handle segment 122. In the cross-section, the elongated area 122-3 that accepts the shaft 48 is opposite the area 122-5 into which fits the spring 40 and the button 49. The screw 47 couples the button 49 to shaft 48.

Figure 7:
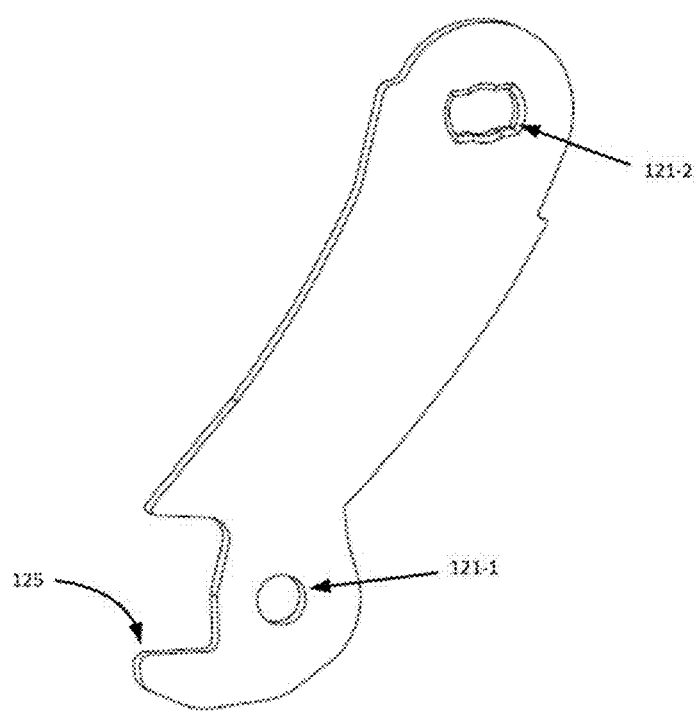
FIG. 7 depicts a side perspective view of the first handle segment.

FIG. 7 depicts a side view of first handle segment 121. The first handle segment 121 of handle 120 may include a projection 125, a distal end hole 121-1, and a proximal end release structure hole 121-2. The projection 125 is positioned to contact the frame, such as 50 of FIG. 1, during pivoting of handle 120 from the closed position 105 to the open position 106. FIGS. 1C and 1D illustrate the contact between projection 125 and server 50. The contact between projection 125 and server 50 during pivoting of handle 120 toward open position 123 causes movement of PCB 10 out of server 50, as shown in FIGS. 1D and 1E. Projection 125 and handle 120 thereby provide a levering action to eject PCB 10 from server 50. The proximal end release structure hole 121-2 is configured to engage the shaft 48 to thereby prevent pivoting of the second handle segment (not shown in this example) from pivoting about the first handle segment 121.

Figure 8A:
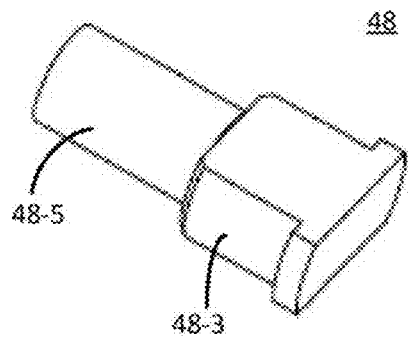
FIG. 8A depicts a perspective view of the shaft.

FIG. 8A depicts a perspective view of shaft 48. The release structure 123 includes a shaft 48 movable between an engaged position and a depressed position. The shaft is biased by a compression element toward the engaged position and movable toward the released position by depression of the button. The release structure is in the released position when the button is depressed. The shaft 48 has an end portion, such as elongated region 48-3 that is rectangular in shape, to prevent rotational movement of the shaft relative to the handle when the shaft is in the engaged position and to permit rotational movement of the shaft relative to the handle when the shaft is in the depressed position. When the release structure 123 is in the engaged position, the elongated region 48-3 fills the proximal end release structure hole 121-2 of the first handle segment 121. The shaft 48 also includes a circular shaft portion 48-5 that is circular and smaller in diameter than the width of the elongated region 48-3. The circular shaft portion 48-5 allows the second handle segment 122 to pivot about the first handle segment 121.

Figure 8B:
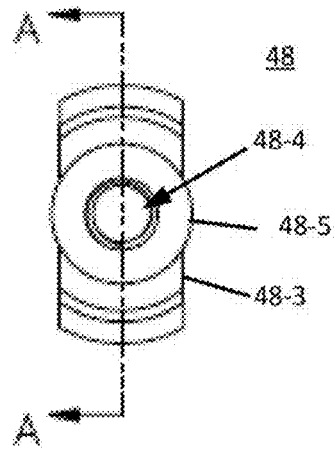
FIG. 8B depicts a bottom view of the shaft.

FIG. 8B depicts a bottom view of shaft 48. The bottom view of the shaft 48 illustrates the difference in the diameter of the circular shaft portion 48-5 as compared to the width of the elongated region 48-3. In addition, the screw hole 48-4 is also shown as centered in the shaft portion 48-5.

Figure 8C:
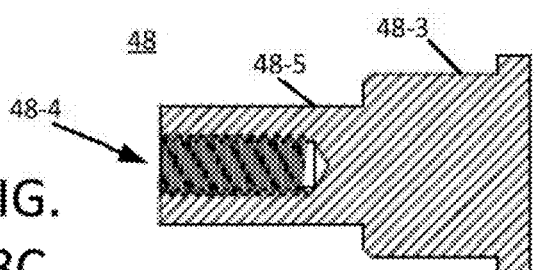
FIG. 8C depicts a cross-section view of the shaft.

FIG. 8C depicts a cross-section view of shaft 48 with the screw hole 48-4 in the circular shaft portion 48-5 which flows into the elongated region 48-3.

Figure 9A:
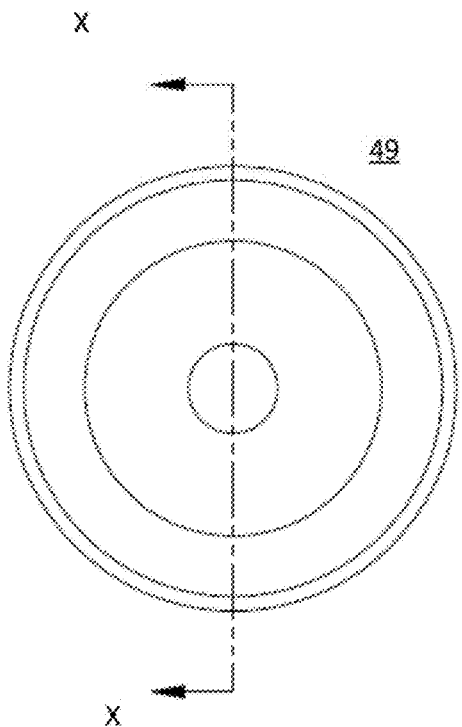
FIG. 9A depicts a top view of the button.
Figure 9B:
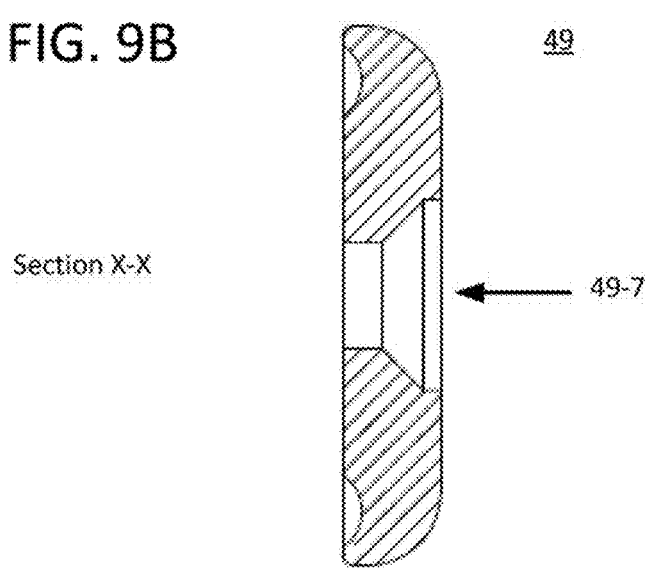
FIG. 9B depicts a cross-section view of the button.

FIG. 9A depicts a top view of the button 49. The button 49 may be a circular element that is configured to be depressed by a user. While the shape of the button 49 is shown as circular, the shape may be any shape such as a square, oval-shaped, a diamond, a triangle or any other form of polygon. The button 49 includes a recess for insertion of a fastener, such as screw 47 to couple the button 49 to the shaft 48 of FIGS. 8A-8C. FIG. 9B depicts a cross-section view of the button 49. In cross-section, the depression 49-7 is shown as a recess configured for fitting of the screw head of screw 47.

FIG. 10A depicts a perspective view of system including second embodiment ejectors with second release structure in the extended position holding as an example, a transceiver module board in piece. In more detail with regard to the system 101 that includes the ejector latch assembly 110 and the board 1000, the perspective view of FIG. 10A illustrates a board 1000 coupled to an ejector latch assembly 1100. Ejector latch assembly 1100 includes a base 110, a captive screw 163, a first handle segment 1121, a release structure 1123, and a second handle segment 1123. The first handle segment 1121, the release structure 1123, and the second handle segment 1123 are coupled to base 110. Base 110 when is coupled to a frame, such as frame 50 of FIG. 1A, is secured to the frame by captive screws 163. The ejector latch assembly 1100 is shown with the first handle segment 1121 in the closed position and the second handle segment 1122 in the extended position.

FIG. 10B depicts a front view with second embodiment ejector pivoted to retracted position showing the access to transceiver module board provided by ejector in the retracted position. As shown in the front view of the ejector latch assembly 1100, when the first handle segment 1121 is in the closed position and the second handle segment 1123 is in the extended position, there is minimal clearance for connectors that may connect to the components, such as receptacles 331.

FIG. 11A is a side view of a second embodiment of a ejector latch assembly with the second handle segment in the extended position. In this example, the second handle segment 1122 is obstructing access to the receptacles 331 of the board 1000. As shown, the captive screw 163 secures the ejector latch assembly to the frame 500. In the left side of the figure, the board 500 is shown as see-through to reveal the detail of the ejector projection 1125. The ejector projection 125 is shown further assisting the captive screw 163 in securing and properly seating the board 1000 into the frame 500. The first handle segment 1121 is shown in the closed position. The release structure 1123 is shown in the engaged position, and the second handle segment is shown in the extended position.

FIG. 11B depicts a detailed style view of the second embodiment ejector latch assembly 1100 in the extended position. The base 110 is configured to secure the ejector latch assembly 1100 to a frame 500 (not shown in this example) of a computing device. The base 110 is secured to the frame by captive screw 163. The first handle segment 1121 includes an extended-position recess 1121-1 and a retracted position recess 1121-2.

FIG. 12A illustrates a handle of an ejector latch assembly incorporating the second embodiment of the release mechanism in a forty-five degree (45°) fold between the first handle segment and the second handle segment. As illustrated in this example, the second handle segment 1122 is away from the board 10 at an approximately 45° angle. The second handle segment 1122, when in 45° fold position, is approximately midway between the extended position of the second handle segment 122 shown in FIGS. 11A and 11B and the retracted position, shown in FIG. 2. This position provides increases access to board 10 components such as transceiver component 333. In the 45° fold configuration, the release structure 1123 is disengaged, the first handle segment 1121 is in the closed position, and the second handle segment 1122 is between the extended and retracted positions. The state of the release mechanism is shown in more detail in FIG. 12B.

In FIG. 12B, the release structure 1123 includes the lever or rocker 1123-8 and the detent 1123-9 of the release structure 1123. The first handle segment 1121 includes the extended-position recess 1121 and the retracted position recess 1121-2. In the 45° fold configuration, the first handle segment 1121 is in the closed position, and the release structure 1123 is in a state between the extended and retracted positions. To achieve the 45° fold, the release structure 1123 is situated such that the lever 1123-8 is in an actuated state thereby compressing spring element 1123-4 and pulling back release arm 1123-7 such that the detent 1123-9 is between the extended-position recess 1121-1 and the retracted position recess 1121-2 of the first handle segment 1121.

FIG. 13A depicts a side view with second embodiment ejector pivoted to retracted position showing the access to transceiver module board provided when the ejector handle is in the retracted position. When in the second handle segment 1122 is in the retracted position, full access to the board 10 components such as transceiver component 333 is provided. In the retracted position configuration, the release structure 1123 is engaged, the first handle segment 1121 is in the closed position, and the second handle segment 1122 is in retracted positions. The state of the release mechanism is shown in more detail in FIG. 13B.

FIG. 13B depicts detailed side view of the second embodiment of the ejector latch mechanism in isolation in the retracted position. The lever or rocker 1123-8 of the release structure 1123 is in the engaged position which indicates that the detent 1123-9 of the release arm 1123-7 is pressed into retracted-position recess 1121-2 of the first handle segment 1121. The spring element 1123-4 is extended to maintain pressure on the release arm 1123-7 to prevent the detent 1123-9 from slipping from the retracted-position recess 1121-2.

FIG. 14A depicts a side view with second embodiment ejector latch assembly pivoted to open position for removing a board inserted in the frame. In this example, the first handle segment 1121 is moved to the open position. When in the open position, the board 30 is pressed out of the frame by the distal end of the first handle segment 1121. As shown in this example, the release structure 1123 is maintained in the engaged position with the second handle segment 122 locked in the extended position. FIGS. 14A-B depict positions of the ejector that permit increased access to the components of the board 30 without having to remove the handles.

FIG. 14B depicts a detailed isolated, side view of the second embodiment of the ejector latch assembly rotated to the open position for removing a board inserted in the frame. As shown in the detail of FIG. 14B, the ejector protrusion 1125 at the distal end of the first handle segment 1121 is rotated about base pivot point 115 and laterally away from the frame (not shown in this example) and toward an edge of the board 30 (also not shown). The second handle segment 1122 is locked in the extended position by the release structure 1123. In particular, the detent 1123-9 of the release structure 1123 is positioned within the extended-position recess 1121-1 of the first handle segment 1121.

FIG. 15 depicts a detailed perspective view of system of the second embodiment of the release structure 1123. The release structure 1123 includes an actuator 1123-8, a release arm 1123-7, an end portion 1123-9, a compression element 1123-4 and a release arm pivot 1123-5. The actuator 1123-8 is coupled to the release arm 1123-7. The end portion 1123-9 may be a detent or other structure. The actuator 1123-8 is movable between a first position in which the release structure 1123 is in the engaged position and a second position in which the release structure is in the released position. The actuator 1123-8 may be, for example, a lever, a slide or rocker. The lever 1123-8 has an end portion, such as detent 1123-9, shaped to prevent pivotal movement of the first handle segment relative to the second handle segment when the lever is in the engaged position and to permit pivotal movement of the first handle segment relative to the second handle segment when the lever is in the pivoted position. The lever is oriented for pivotal movement about a pivot axis and the distal end portion of the second handle segment pivots relative to the proximal end portion of the first handle segment about the pivot axis. The release arm 1123-7 includes the detent 1123-9 on a side facing the proximal end of the first handle segment (not shown in this example). Opposite the detent 1123-9 and adjacent to the release arm 1123-7 is the compression element 1123-4, such as a spring made of metal or plastic. The compression element 1123-4 maintains a pressure on the release arm 1123-7 that is transferred to the detent 1123-9 when the detent is positioned in a recess, such as recesses 1121-1 and 1121-2.

Figure 16A:
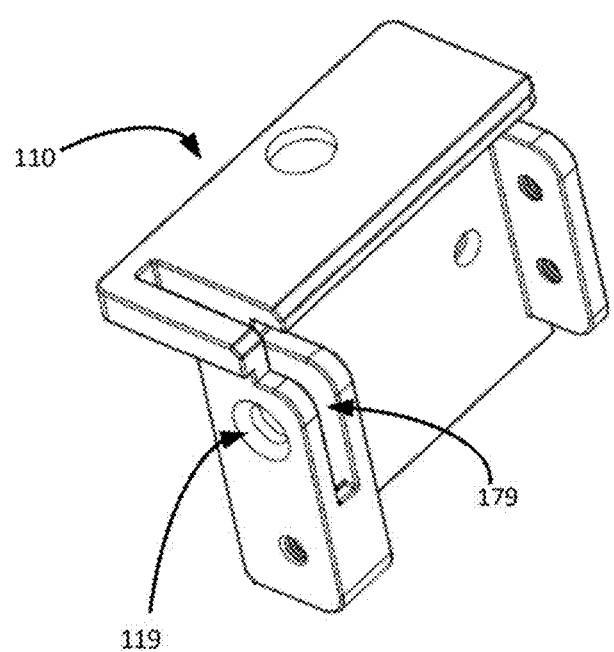
FIGS. 16A-G depict various perspective, isometric and cross-sectional views of a base usable with the ejector of either the first or the second embodiment.
Figure 16B:
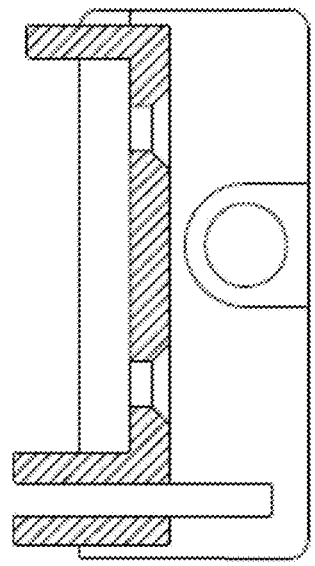
Figure 16C:
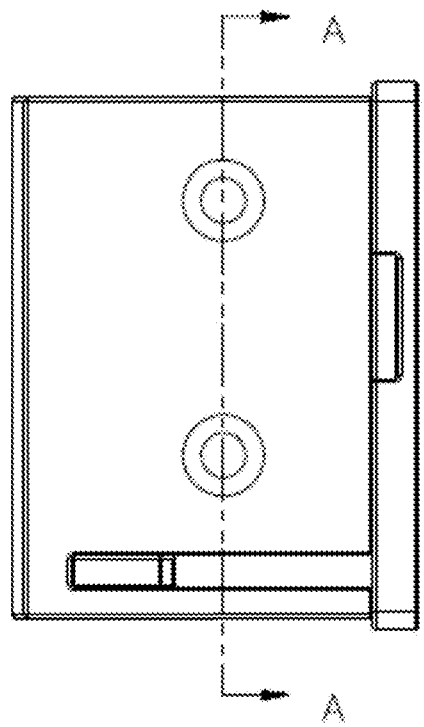
Figure 16D:
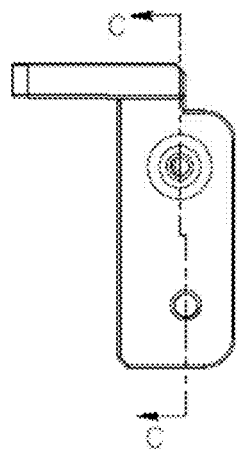
Figure 16E:
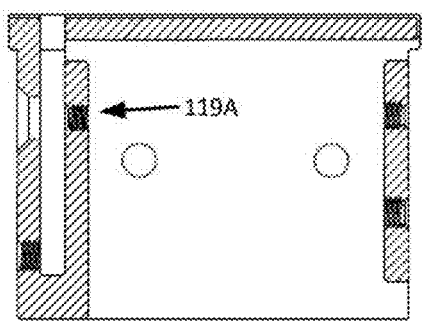
Figure 16F:
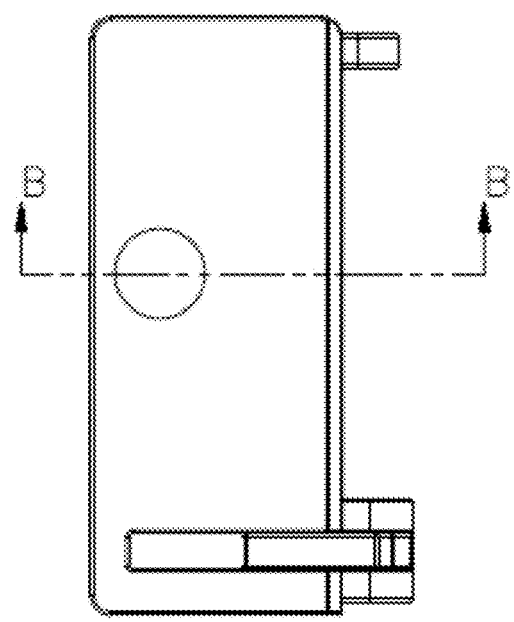
Figure 16G:
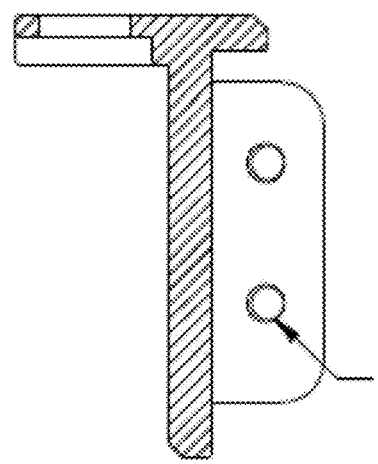

FIGS. 16A-G illustrate various base 110 configurations that are contemplated and that the mounting holes and surfaces can be selected from among many alternatives depending on the type and shape of the board, the frame, clearance room, material selections, and other variations associated with a particular application. Therefore, a detailed discussion of FIGS. 16B-G has been omitted. In FIG. 16A, a base 110 is illustrated usable with the handles 120 as described above. The base 110 includes a slot 179 into which is inserted the distal end of a first handle segment, such as 121 of FIG. 2 or 4. The hole 119 is configured to receive a screw, such as 41 of FIG. 4. The screw passes through a hole in the distal end of the first handle segment, and is secured in a threaded recess, such as 119A of FIG. 16E. The screw when passed through the hole in the distal end of the first handle segment and inserted in the threaded recess 119A thereby secures the first handle segment to the base 110. The hole in the distal end of the first handle segment has a diameter that allows the first handle segment to substantially rotate about the screw.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ejector latch assembly configured for securing a board within a frame, the ejector latch assembly comprising:
   a base configured to be coupled to a board; and
   a handle mounted to the base, the handle having:
      a first handle segment having a proximal end portion and a distal end portion pivotably coupled to the base, the first handle segment being pivotable relative to the base between a closed position and an open position,
      a second handle segment having a distal end portion pivotably coupled to the proximal end, portion of the first handle segment, the second handle segment being pivotable relative to the first handle segment between an extended position and a retracted position without movement of the first handle segment, and a release structure operatively engaged with both the first handle segment and the second handle segment, the release structure movable between an engaged position in which the release structure prevents pivoting of the second handle segment relative to the first handle segment and a released position in which the release structure does not prevent pivoting of the second handle segment relative to the first handle segment, the first handle segment and the second handle segment being positioned such that access to the board is increased when the first handle segment is maintained in the closed position and the distal end portion of the second handle segment is pivoted relative to the proximal end portion of the first handle segment toward the retracted position, while the board is secured within the frame.

2. The ejector latch assembly of claim 1, the release structure comprising a button movable between an extended position in which the release structure is in the engaged position and a depressed position in which the release structure is in the released position.

3. The ejector latch assembly of claim 2, the release structure further comprising a shaft movable between an engaged position and a depressed position the shaft being biased toward the engaged position and movable toward the released position by depression of the button, wherein the release structure is in the released position when the button is depressed.

4. The ejector latch assembly of claim 3, the release structure further comprising a spring positioned to bias the shaft toward the engaged position.

5. The ejector latch assembly of claim 3, the shaft having an end portion shaped to prevent rotational movement of the shaft relative to the handle when the shaft is in the engaged position and to permit rotational movement of the shaft relative to the handle when the shaft is in the depressed position.

6. The ejector latch assembly of claim 2, wherein the button is oriented for movement along a depression axis and the distal end portion of the second handle segment pivots relative to the proximal end portion of the first handle segment about the depression axis.

7. The ejector latch assembly of claim 1, the release structure comprising an actuator movable between a first position in which the release structure is in the engaged position and a second position in which the release structure is in the released position.

8. The ejector latch assembly of claim 7, the actuator including a lever pivotally mounted to the first handle segment or the second handle segment of the handle, the lever being movable between an engaged position and a pivoted position in which the release structure is in the released position, the lever being biased toward the engaged position and movable toward the pivoted position by pivoting the lever relative to the first handle segment or the second handle segment of the handle.

9. The ejector latch assembly of claim 8, the release structure further comprising a spring positioned to bias the lever toward the engaged position.

10. The ejector latch assembly of claim 8, the lever having an end portion shaped to prevent pivotal movement of the first handle segment relative to the second handle segment when the lever is in the engaged position and to permit pivotal movement of the first handle segment relative to the second handle segment when the lever is in the pivoted position.

11. The ejector latch assembly of claim 8, wherein the lever is oriented for pivotal movement about a pivot axis and the distal end portion of the second handle segment pivots relative to the proximal end portion of the first handle segment about the pivot axis.

12. A computer assembly comprising:
a frame;
a board supported by the frame; and
an ejector latch assembly securing the board within the frame, the ejector latch assembly including
a base configured to be coupled to a board; and
a handle mounted to the base, the handle having
a first handle segment having a proximal end portion and a distal end portion pivotably coupled to the base, the first handle segment being pivotable relative to the base between a closed position and an open position,
a second handle segment having a distal end portion pivotably coupled to the proximal end portion of the first handle segment, the second handle segment being pivotable relative to the first handle segment between an extended position and a retracted position without movement of the first handle segment, and
a release structure operatively engaged with both the first handle segment and the second handle segment, the release structure movable between an engaged position in which the release structure prevents pivoting of the second handle segment relative to the first handle segment and a released position in which the release structure does not prevent pivoting of the second handle segment relative to the first handle segment;
the first handle segment and the second handle segment being positioned to increase access to the board when;
the first handle segment is maintained in the closed position, and
the distal end portion of the second handle segment is pivoted relative to the proximal end portion of the first handle segment toward the retracted position.

13. The computer assembly of claim 12, comprising plural ejector latch assemblies securing the board within the frame.

14. The computer assembly of claim 12, the board comprising a PCB.

15. A computer assembly comprising:
a frame;
a board supported by the frame; and
an ejector latch assembly securing the board within the frame, the elector latch assembly including
a base configured to be coupled to a board; and
a handle mounted to the base, the handle having
a first handle segment having a proximal end portion and a distal end portion pivotably coupled to the base the first handle segment being pivotable relative to the base between a closed position and an open position,
a second handle segment having a distal end portion pivotably coupled to the proximal end portion of the first handle segment, the second handle segment being pivotable relative to the first handle segment between an extended position and a retracted position when the first handle segment is in the closed position, and a release structure operatively engaged with both the first handle segment and the second handle segment, the release structure movable between an engaged position in which the release structure prevents pivoting of the second handle segment relative to the first handle and a released position in which the release structure does not prevent pivoting of the second handle segment relative to the first handle segment;

the first handle segment and the second handle segment being positioned to increase access to the board when:

the first handle segment is maintained in the closed position, and the distal end portion of the second handle segment is pivoted relative to the proximal end portion of the first handle segment toward the retracted position, and the board being moveable relative to the frame in an eject direction when the first handle segment is pivoted to open position, the board comprising at least one component extendable from the board in the eject direction, wherein access to the at least one component is increased when the first handle segment is maintained in the closed position, and the distal end portion of the second handle segment is pivoted relative to the proximal end portion of the first handle segment toward the retracted position.

16. A method for increasing access to a board supported in a frame of a computer system, the method comprising:

securing the board within the frame using an ejector latch assembly in which a first handle segment of a handle of the ejector latch assembly is relative to a base of the ejector latch assembly toward a closed position;

moving a release structure operatively, engaged with both the first handle segment and the second handle segment of the ejector latch assembly from an engaged position in which the release structure prevents pivoting of a second handle segment of the handle relative to the first handle segment to a released position in which the release structure does not prevent pivoting of the second handle segment of the handle relative to the first handle segment of the handle; and pivoting the second handle segment of the handle relative to the first handle segment of the handle toward a retracted position without movement of the first handle segment, thereby increasing access to the board while the first handle segment of the handle is maintained in the closed position.

17. The method of claim 16, wherein the step of moving the release structure of the ejector latch assembly from the engaged position to the released position comprises moving a button from an extended position in which the release structure is in the engaged position toward a depressed position in which the release structure is in the released position.

18. The method of claim 16, wherein the step of moving the release structure of the ejector latch assembly from the engaged position to the released position comprises moving an actuator from a first position in which the release structure is in the engaged position toward a second position in which the release structure is in the released position.

* * * * *